Jan. 7, 1958 E. O. KEIZER ET AL 2,819,353

AUTOMATIC GAIN CONTROL CIRCUIT

Filed March 1, 1954

INVENTORS
EUGENE O. KEIZER &
MARLIN G. KROGER

BY [signature]

ATTORNEY

United States Patent Office 2,819,353

Patented Jan. 7, 1958

2,819,353

AUTOMATIC GAIN CONTROL CIRCUIT

Eugene O. Keizer, Princeton, N. J., and Marlin G. Kroger, Oak Park, Ill., assignors to Radio Corporation of America, a corporation of Delaware Application March 1, 1954, Serial No. 413,206

3 Claims. (Cl. 179—171)

The present invention relates to improvements in automatic gain control circuits and more particularly, although not necessarily exclusively, to improvements in automatic gain control circuits for use in television signal reception.

More directly, the present invention relates to simplified means for improving the performance of automatic gain control circuits in general, under extremes of weak and strong signal conditions, with particular attention being directed to improving the overall performance of automatic gain control circuits of the type used in home type television receivers.

Noise immunity in radio receiving equipments incorporating automatic gain control circuits depends in part upon the ability of the automatic gain control circuit to respond quickly to variations in the amplitude of the received radio signal carrier, yet to effectively ignore changes in the apparent signal strength attributable to noise bursts and the like.

In the prior art, the approach to achieving increased noise immunity in automatic gain control circuits has been generally on a time constant basis. When making the time constant or "response" time of the AGC (automatic gain control) circuits sufficiently long, rapid changes in the effective strength of received signals due to occasional noise brusts do not affect the developed automatic gain control potential to any appreciable extent. However, in television receivers, if short time constant is used during the reception of very strong signals, it is well known that the vertical synchronizing component will be erroneously sensed as an increase in signal strength which will in turn effectively paralyze the receiver for a period immediately following vertical sync intervals. If the time constant of the AGC circuit is made too long, cyclic variations in the received carrier strength itself, as, for example, caused by airplane doppler "flutter" interference as encountered in V. H. F. and U. H. F. reception will not be sufficiently compensated or corrected.

It is the general practice in television receiver design, therefore, to reach a compromise in valuing the so-called time constant of an automatic gain control circuit. This compromise is based upon the above considerations whereby to arrive at an automatic gain control circuit with a sufficiently long time constant to substantially reduce undesirable response to noise bursts and vertical sync, yet of sufficiently short time constant value to permit compensation for periodic changes in the actual strength of received signal.

The present invention takes advantage of the fact that a given percentage of variation in signal amplitude, attributable for example to "airplane flutter," at a given receiving location will be much more objectionable during the reception of weak radio signal carriers than during the reception of strong radio signal carriers. In accordance with the present invention, it is found possible to greatly reduce the time constant value of an automatic gain control circuit during the reception of weak signals so that rapid changes in received signal carrier, such as encountered in the above-mentioned airplane flutter doppler effect may be compensated in U. H. F. and V. H. F. signal reception. On the other hand, it is found practicable to compromise somewhat the ability of the automatic gain control circuit to correct for so-called airplane flutter when receiving strong signals in favor of increasing the time constant value of the AGC system, so as to minimize response to vertical synchronizing pulses.

It is, therefore, an object of the present invention to provide a new and improved automatic gain control circuit.

It is further an object of the present invention to provide a novel control circuit applicable to automatic gain control circuits in general, to improve their overall performance.

It is further an object of the present invention to provide a new and improved control circuit for automatic gain control circuits, finding particular application in television receiving circuits.

It is yet another object of the present invention to provide means for automatically conditioning the characteristics of an automatic gain control circuit for use in radio receiving systems, so as to exhibit an optimum response speed for a variety of signal strength conditions.

In the realization of the above objects and features of advantage, it is contemplated, in the practice of the present invention, to provide means for automatically changing the time constant value of an automatic gain control circuit as an inverse function of the received signal strength.

A better understanding of the present invention, as well as an appreciation of other objects and features thereof, will be obtained from a reading of the following specification, especially when taken in connection with the accompanying drawings, in which.

Figure 1:
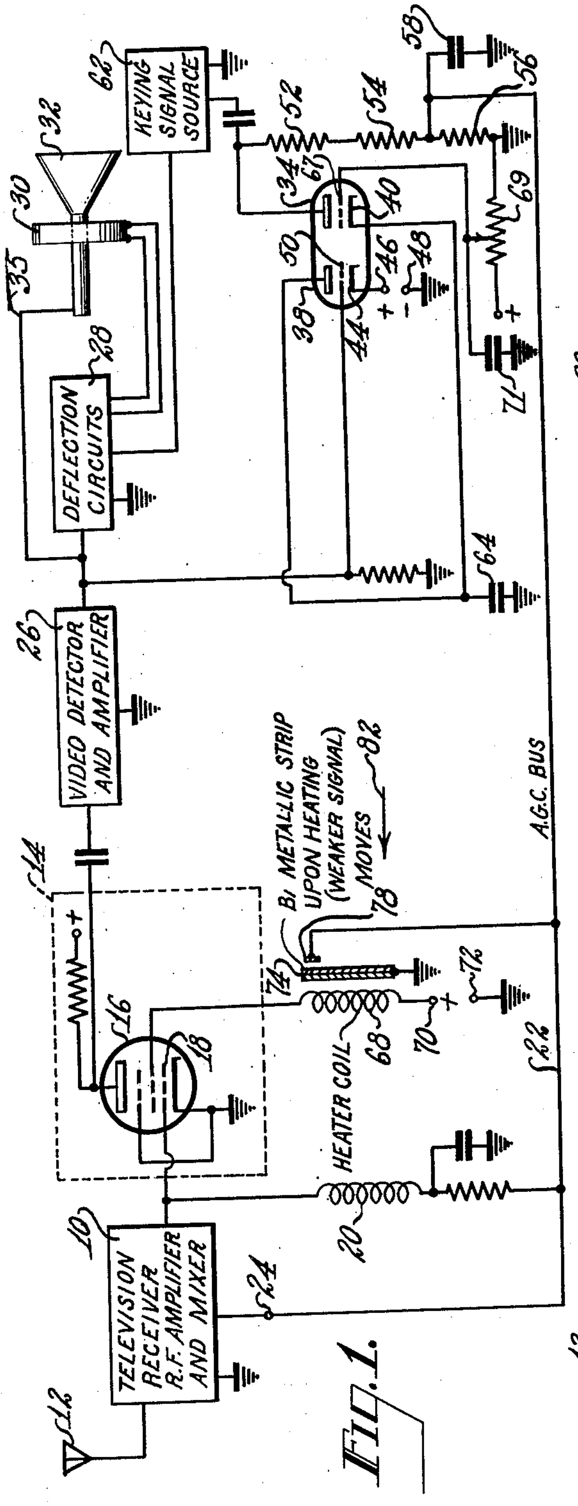
Figure 1 is a combination schematic and block representation of one form of television receiving circuit in which the present invention finds ready employment.

Turning now to Figure 1, there is indicated in block form at 10 the conventional elements of a television receiver tuning device which is capable of receiving radio frequency signals on the antenna 12 and converting them to intermediate frequency signals for application to an intermediate frequency amplifier shown in the dotted line rectangle 14. The intermediate frequency amplifier shown in block 14 includes a vacuum tube 16 whose control electrode 18 is connected through an isolating inductor 20 to an AGC bus 22. The AGC bus 22 is also connected to the terminal 24 of the tuner 10. Automatic gain control potential appearing on the bus 22 will, therefore, control the gain of both the intermediate frequency amplifier and the R–F tuner. Additional stages of intermediate frequency amplification may be included in the dotted rectangle 14 if desired. For purposes of illustrational convenience only a single stage has been shown.

Output signal from the intermediate frequency amplifier 14 is shown to be capacitively coupled to the video frequency detector and amplifier circuit 26 whose output signal is in turn coupled to the deflection circuits indicated in block form at 28. Deflection signals developed by the deflection circuit 28 are applied to an electromagnetic deflection yoke 30 surrounding the neck of the kinescope 32. Video signal applied to the deflection circuit 28 is also conveyed by a cricuit path 35 to a suitable electrode within the kinescope 32 for video signal modulation of the electron beam therein.

The particular form of automatic gain control circuit shown in Figure 1 is of a type described and claimed in copending United States patent application, Serial No.

402,007, filed January 4, 1954, entitled "Automatic Gain Control Means" by E. O. Keizer et al.

In this referenced patent application, two tubes are serially connected with one another across a source of cyclically recurrent alternating current signal. A storage capacitor is then connected from the junction of the two tubes to one terminal of the source of cyclically recurrent alternating signal whereby to permit one of the tubes to act as a unilateral conductive charging means for the capacitor. Received radio signal is then applied to the other tube to control its impedance in effectively discharging the storage capacitor. Charging current through the first tube for replacing the charge dissipated by the second tube is then caused to develop an automatic gain control potential.

In Figure 1, the two serially connected tubes of the Keizer system are shown at 34 and 38. The cathode 40 of tube 34 is connected with the anode electrode of tube 38. For purposes of convenience, the tubes 34 and 38 have been shown as being in the same envelope such as, for example, provided by a 6SN7 type tube. A source of positive biasing potential for the cathode 44 of tube 38 may be applied across the terminals 46 and 48 with the polarity indicated. Demodulated and amplified video signal is applied directly to the control electrode 50 of tube 38. A load circuit comprising resistors 52, 54 and 56 is connected from the anode of tube 34 to circuit ground. A storage capacitor 58 is connected in shunt with that portion of the anode load resistance for tube 34 provided by the resistor 56. Keying signals are applied to the anode of tube 34 from a keying signal source 62 which may be in some instances incorporated in the deflection circuits 28. It is common practice in the art to derive keying signals which synchronously relate to received horizontal synchronizing pulses directly from the horizontal deflection yoke winding or other points in the output circuit of a horizontal deflection signal amplifier. A capacitor 64 is connected from the cathode 40 of the tube 34 and circuit ground. The control electrode 67 of tube 34 is connected with a bias bleeder resistor 69. Capacitor 71 maintains the control electrode 67 at substantially alternating current ground potential whereby to afford shielding between anode and cathode of the tube. This prevents feed-through of keying pulses to the deflection circuits proper.

The basic operation of the television receiving system, including illustrations of well known circuitry for the block elements in Figure 1, as well as the block elements hereinafter to be discussed, is set forth in the "Radio Set and Service Review" section of the "Radio Electronics" Magazine for November 1950, pages 34 and 36. The operation of the basic automatic gain control circuit embracing tubes 34 and 38 disclosed in the above-identified Keizer et al. application is substantially as follows:

The pulse keying signal applied to the anode of tube 34 is positive going in polarity and is rectified to develop a potential across the storage capacitor 64. The keying signal will be effectively peak detected so that the voltage across capacitor 64 will represent to a substantial degree the peak value of the signal during the reception of weak signals. Upon the increase in signal strength of an incoming television signal, and assuming a sync positive polarity for the signal delivered by the video detector amplifier 26 to the grid 50 of tube 38, tube section 38 will become more conductive and tend to bleed some of the charge from capacitor 64. Tube 34 will, therefore, conduct upon the occurrence of the next keying signal or pulse applied to its anode in an attempt to recharge the capacitor 64. This charging current must of necessity flow through the resistors 52, 54 and 56, and, therefore, develop an automatic gain control potential across the resistor 56. The value of capacitor 58 is chosen in conjunction with the value of resistor 56 to provide a suitable minimum time constant value for the automatic gain control system.

In accordance with the present invention, it will be noted that the screen electrode of the video I. F. amplifier 16 is connected through a heater coil 68 to a source of positive polarizing potential having a positive terminal at 70 and a negative terminal at 72. Heater coil 68 is physically positioned with respect to a bimetallic strip 74 which is connected with circuit ground. A capacitor plate 78 is positioned with respect to the bimetallic strip 74 so as to provide a variable capacitance unit which is sensitive to changes in heat developed by the heater coil 68. The capacitor plate 78 is connected to the AGC bus 22 whereby to alter the R-C time constant value of the AGC bus, in accordance with current demands of the intermediate frequency amplifier tube 16.

Another way of viewing the function of the variable capacitor provided by the bimetallic strip 74 and fixed plate 78 is that it supplements the minimum valued capacitance 58 in establishing the time constant characteristic of the AGC system. The maximum value of capacitance which the bimetallic capacitance means is capable of exhibiting should be such that when supplemented by the fixed capacitance 58 the response speed of the AGC system is at the lowest desirable value.

In the operation of the present invention a reduction in received signal strength will reduce the amount of charge bled from the capacitor 64 through the tube 38. This will necessitate less charging current in the tube 34 to keep the capacitor 64 charged to a stabilized value. The voltage drop across resistor 56 will, therefore, decrease and the AGC bus 22 will assume a potential less negative with respect to circuit ground. This will, in accordance with conventional receiver design techniques, increase the gain of the signal amplifiers within the tuner 10 and the video intermediate frequency amplifier 14. As the control electrode 18 of tube 16 becomes less negative with respect to circuit ground, current through the tube 16 will increase and the heat radiated by the coil 68 will cause the bimetallic strip 74 to move in the direction of the arrow 82. This will decrease the capacitance between the bimetallic strip 74 and the plate 78, thereby causing the time constant value of the AGC system to become smaller and increase its response speed. Under these conditions, periodic signal fading, such as caused by airplane fluttering interference, will be minimized in their effect on reproduced picture. However, upon the reception of a stronger signal, the AGC bus 22 will become more negative with respect to circuit ground and decrease the current flow through the video I. F. amplifier 16. Less heat will, therefore, be applied to the bimetallic strip 74 which in turn will cause movement of the bimetallic strip toward the capacitor plate 78. This in turn will increase the time constant value of the AGC system and decrease its speed of response. Thus, the AGC circuit will be effectively reduced in its sensitivity to amplitude variations such as that apparent during the vertical sync period. In the light of such considerations, it is desirable in selecting capacitor values that the minimum capacitance provided by the bimetallic capacitance means, taken in conjunction with the fixed capacitor 58, be sufficiently small to yield an AGC response speed which will properly compensate for airplane flutter interference.

Figure 2:
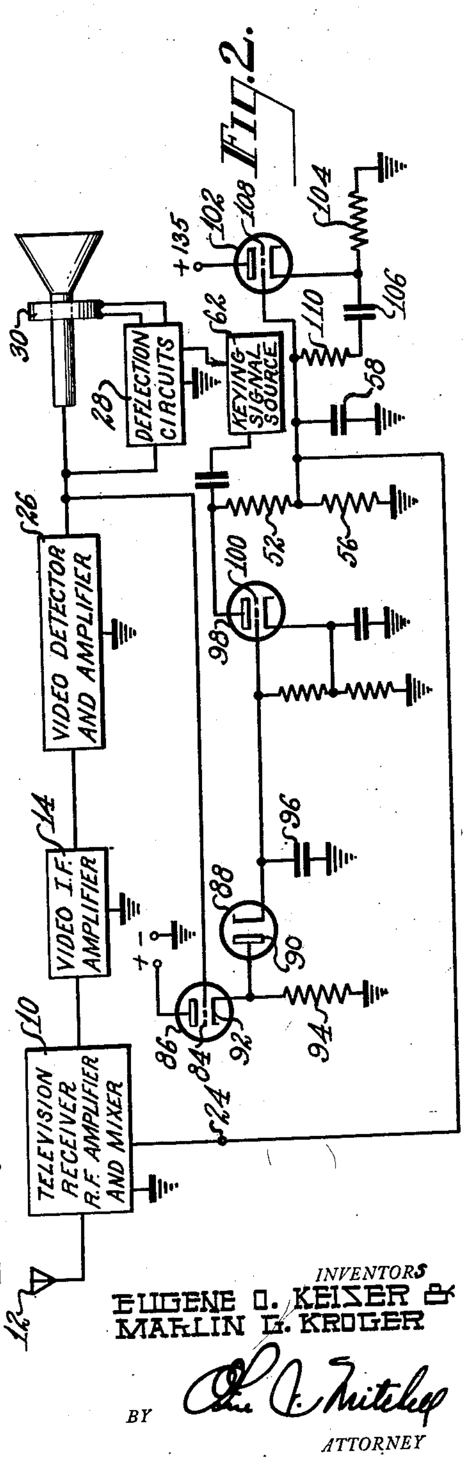
Figure 2 is a combination block and schematic representation of still another form of television receiving system in which the present invention is employed.

In the embodiment of the invention shown in Figure 2, there is shown still another way of controlling the effective response speed of the automatic gain control system as a function of signal strength. The basic television receiving circuit of Figure 2 is substantially the same as that shown in Figure 1, and correspondingly, like elements in both figures have been given like reference numerals.

In Figure 2, however, demodulated video signal appearing at the output terminal of the video frequency amplifier 26 is applied to the control electrode 84 of a cathode follower amplifier tube 86. Diode detector 88 has its anode 90 connected with the cathode 92 of the cathode follower amplifier tube 86. Signals appearing across the cathode follower load resistor 94 are, therefore, peak detected to produce a charge on the capacitor 96 which is proportional to the peak amplitude of the received signal. The AGC amplifier stage 98 is supplied with peak signal information by connecting its control electrode 100 to the capacitor 96. The tube 98 is rendered conductive by a keying signal source 62, as in Figure 1. Load resistors 52 and 56, as well as the capacitor 58, provide the same functions as they did in Figure 1, so that an automatic gain control potential is available at the AGC terminal 24.

Control of the AGC time constant, in accordance with this embodiment of the present invention is accomplished by means of a time constant control tube 102 connected as a cathode follower type amplifier. Resistor 104 acts as the cathode load resistance for the amplifier. In accordance with the present invention a capacitor 106 is connected between the cathode of tube 102 and the control electrode 108. A resistor 110 may be connected in series with the capacitor 106 as shown if desired. By connecting the control electrode 108 to the AGC bus, the time constant of the AGC bus will be caused to vary in accordance with received signal strength. For example, should the received signal decrease in amplitude, the AGC bus 24 will swing in a positive direction with respect to circuit ground so as to increase the gain of the television receiver 10. This will cause greater amplification in the control tube 102 so that the voltage at the cathode will more closely approximate the voltage at the control electrode 108. Under these conditions, capacitor 106 will have less effect on the AGC bus since every voltage change on the left hand terminal of the capacitor 106 will be matched by almost an equivalent voltage change on the right hand terminal of the capacitor. Thus, as the received signal decreases in amplitude, the control tube 102, and particularly the capacitor 106 will effectively decrease the time constant value of the AGC circuit with the attendant advantages described above. On the other hand, should the received signal increase in intensity, the AGC voltage applied to the control electrode 108 of tube 102 will become more negative. This will cause the capacitor 106 to become more effective and consequently increase the time constant value of the AGC circuit. Thus, the additional energy of the received television signal represented by the vertical synchronizing signal waveform will have less effect on the AGC bus potential due to the effective longer time constant thereof.

It is noted that the novel control circuit 102 may be applied to a numerous electrical circuits at any point therein where it is desired to vary the time constant value apparent at that point as a function of the potential of that point.

What is claimed is.

1. In a superheterodyne television system the combination of: an intermediae frequency amplifier; a power supply for said amplifier; an automatic gain control circuit connected with said amplifier such that the gain and power demands of said amplifier vary as a function of the received signal strength, said automatic gain control circuit including means for connecting an electrical circuit parameter, variations in the value of which will cause variations in the response speed of said automatic gain control circuit; a heater element connected between said power supply and said amplifier; temperature resistive electrical parameter means, the electrical value of which is a function of the temperature thereof; means thermally coupling said parameter means with said heater element means; and means electrically coupling said parameter means with said automatic gain control circuit to vary the response speed of said gain control circuit in response to thermal changes in said heater element and hence in response to received signal strength.

2. A superheterodyne television receiving system, according to claim 1, wherein said automatic gain control circuit has an output terminal displaying a predetermined time constant value definitive of the response speed of said gain control circuit and wherein said temperature responsive parameter means comprises a temperature responsive variable capacitance device connected across said output terminal.

3. In a signal amplifier system the combination of: a signal amplifier designated to accept electrical signals subject to variations in amplitude, said signal amplifier comprising at least one amplifier stage adapted for automatic gain control, whose power requirements vary as a function of automatic gain control action; an automatic gain control circuit connected with said amplifier stage for stabilization of the amplitude of signals delivered by said amplifier; power supply means for said amplifier; thermo-electric variable capacitance means including an actuating heating coil connected between said amplifier stage and said power supply means for producing a variable capacitance in response to changes in the power requirements of said amplifier stage; and means connecting the variable capacitance portions of said thermo-electric variable capacitance means in shunt with the connection of said automatic gain control circuit to said amplifier.

References Cited in the file of this patent

UNITED STATES PATENTS

| | | |
|---|---|---|
| 2,156,846 | Getaz | May 2, 1939 |
| 2,404,160 | Boucke | July 16, 1946 |
| 2,441,577 | Katzin | May 18, 1948 |
| 2,556,070 | De Groote et al. | June 5, 1951 |